(12) United States Patent
Woo

(10) Patent No.: US 12,106,989 B2
(45) Date of Patent: Oct. 1, 2024

(54) EQUIPMENT FRONT END MODULE

(71) Applicants: PICO & TERA CO., LTD., Suwon (KR); Bum Je Woo, Seongnam (KR)

(72) Inventor: Bum Je Woo, Seongnam (KR)

(73) Assignee: PICO & TERA CO., LTD., Suwon (KR)

( * ) Notice: Subject to any disclaimer, the term of this patent is extended or adjusted under 35 U.S.C. 154(b) by 0 days.

(21) Appl. No.: 18/332,314

(22) Filed: Jun. 9, 2023

(65) Prior Publication Data

US 2023/0317486 A1 Oct. 5, 2023

Related U.S. Application Data

(63) Continuation of application No. 17/836,703, filed on Jun. 9, 2022, now Pat. No. 11,715,659, which is a continuation of application No. 17/107,368, filed on Nov. 30, 2020, now Pat. No. 11,387,125.

(30) Foreign Application Priority Data

Oct. 23, 2020 (KR) ........................ 10-2020-0138086

(51) Int. Cl.
*H01L 21/673* (2006.01)
*H01L 21/67* (2006.01)
*H01L 21/677* (2006.01)

(52) U.S. Cl.
CPC .. *H01L 21/67393* (2013.01); *H01L 21/67167* (2013.01); *H01L 21/67196* (2013.01); *H01L 21/67201* (2013.01); *H01L 21/67376* (2013.01); *H01L 21/67386* (2013.01); *H01L 21/6773* (2013.01)

(58) Field of Classification Search
CPC ......... H01L 21/67389; H01L 21/67775; H01L 21/67778; H01L 21/67167; H01L 21/67196; H01L 21/67201; H01L 21/67376; H01L 21/6773; H01L 21/67772; H01L 21/67017
USPC .......................................................... 454/187
See application file for complete search history.

(56) References Cited

U.S. PATENT DOCUMENTS

| | | | | |
|---|---|---|---|---|
| 7,850,752 B2* | 12/2010 | Mizuno | .................. | B01D 53/40 96/135 |
| 10,658,217 B2* | 5/2020 | Kawai | ............... | H01L 21/67253 |
| 2002/0023458 A1* | 2/2002 | Sakata | .............. | H01L 21/67778 62/378 |
| 2004/0029521 A1* | 2/2004 | Cauthorne | ............... | F24F 11/74 454/229 |
| 2005/0095976 A1* | 5/2005 | Tzeng | ............... | H01L 21/67781 454/187 |
| 2006/0117722 A1* | 6/2006 | Kuo | ........... | B01D 46/62 55/385.2 |
| 2012/0295531 A1* | 11/2012 | Duerig | ...................... | B01L 1/04 454/189 |

(Continued)

FOREIGN PATENT DOCUMENTS

| | | |
|---|---|---|
| KR | 101002949 B1 | 12/2010 |
| KR | 1020150009421 A | 1/2015 |

*Primary Examiner* — Glenn F Myers

(57) ABSTRACT

Proposed is an EFEM configured to perform wafer transfer between a wafer storage device and process equipment. More particularly, proposed is an EFEM that prevents harmful gases inside a transfer chamber in which wafer transfer is performed from escaping out of the EFEM.

3 Claims, 7 Drawing Sheets

(56) References Cited

U.S. PATENT DOCUMENTS

2020/0135525 A1* 4/2020 Reuter .............. H01L 21/67017
2020/0294834 A1* 9/2020 Houng .............. H01L 21/67276

* cited by examiner

EQUIPMENT FRONT END MODULE

CROSS REFERENCE TO RELATED APPLICATION

The present application is a continuation of U.S. patent application Ser. No. 17/836,703 filed Jun. 9, 2022, which is a continuation of U.S. patent application Ser. No. 17/107,368 filed Nov. 30, 2020, now U.S. Pat. No. 11,387,125, which claims priority to Korean Patent Application No. 10-2020-0138086, filed Oct. 23, 2020, the entire contents of which is incorporated herein for all purposes by this reference.

BACKGROUND OF THE INVENTION

Field of the Invention

The present disclosure relates to an equipment front end module (EFEM) configured to perform wafer transfer between a wafer storage device and process equipment.

Description of the Related Art

In a semiconductor manufacturing process, wafers are processed in a clean room in order to improve yield and quality. However, as devices have become more highly integrated, circuits have become finer, and wafers have become larger, maintaining cleanness in the entire clean room has become difficult from both a technical and cost point of view.

Therefore, in recent years, the cleanliness only in a local space around wafers has been managed. For this purpose, a module called equipment front end module (EFEM) has been used for storing wafers in a sealed storage pod called a front-opening unified pod (FOUP), and performing wafer transfer between the FOUP and process equipment that processes the wafers.

Such an EFEM is configured such that a transfer chamber provided with a wafer transfer device is provided, and a load port to which the FOUP is coupled is connected to a first surface of the transfer chamber, and the process equipment is connected to a second surface of the transfer chamber. Accordingly, the wafer transfer device transfers wafers stored in the FOUP to the process equipment and transfers the wafers having been processed in the process equipment into a wafer storage device.

Examples of this EFEM have been disclosed in Korean Patent No. 10-1002949 (hereinafter referred to as 'Patent Document 1') and Korean Patent Application Publication No. 10-2015-0009421 (hereinafter referred to as 'Patent Document 2').

EFEMs disclosed in Patent Documents 1 and 2 are configured such that when wafers stored in a FOUP coupled to a load port are transferred by a robot arm in a transfer chamber, gases are supplied into the transfer chamber, whereby cleanliness in the transfer chamber is managed.

However, as the gases are supplied into the transfer chamber, the pressure inside the transfer chamber becomes higher than that outside the transfer chamber, thereby causing a problem in that the gases inside the transfer chamber may escape out of the transfer chamber.

In other words, as the EFEM is manufactured in a large size, even when the inside of the transfer chamber is sealed, a leak may occur in the transfer chamber.

Therefore, harmful gases including fumes inside the transfer chamber may escape out of the transfer chamber, with the result that contamination may occur outside the EFEM, and thus, there is a problem in that workers may be exposed to harmful gases.

The foregoing is intended merely to aid in the understanding of the background of the present disclosure, and is not intended to mean that the present disclosure falls within the purview of the related art that is already known to those skilled in the art.

Documents of Related Art (Patent document 1) Korean Patent No. 10-1002949
(Patent document 2) Korean Patent Application Publication No. 10-2015-0009421

SUMMARY OF THE INVENTION

Accordingly, the present disclosure has been made keeping in mind the above problems occurring in the related art, and an objective of the present disclosure is to provide an EFEM that prevents harmful gases inside a transfer chamber in which wafer transfer from escaping out of the EFEM.

In order to achieve the above objective, according to one aspect of the present disclosure, there is provided an equipment front end module (EFEM), including: a transfer chamber in which wafers are transferred between a wafer storage device and process equipment, wherein there may be no direct gas flow between the transfer chamber and a vicinity of the EFEM.

Furthermore, gas inside the transfer chamber may be blocked from escaping out of the EFEM.

Furthermore, external gas outside the EFEM may be blocked from flowing into the transfer chamber.

Furthermore, the EFEM may further include at least one chamber provided between the transfer chamber and an outside of the EFEM, and configured to block gas inside the transfer chamber from escaping out of the EFEM while blocking external gas outside the EFEM from flowing into the transfer chamber.

Furthermore, the EFEM may further include at least one chamber provided between the transfer chamber and an outside of the EFEM, and configured such that a pressure therein is maintained lower than a lower pressure from among a pressure inside the transfer chamber and a pressure in the vicinity of the EFEM.

Furthermore, the EFEM may further include: at least one first chamber provided between the transfer chamber and an outside of the EFEM, and configured such that a pressure therein is maintained lower than a lower pressure from among a pressure inside the transfer chamber and a pressure outside the EFEM; and at least one second chamber provided between the transfer chamber and the outside of the EFEM, and configured such that a pressure therein is maintained higher than that inside the first chamber.

Furthermore, the EFEM may further include: at least one first chamber provided between the transfer chamber and an outside of the EFEM, and configured such that a pressure therein is maintained lower than a lower pressure from among a pressure inside the transfer chamber and a pressure outside the EFEM; and a second chamber provided between the first chamber and the outside of the EFEM, wherein a pressure inside the second chamber may be maintained lower than that outside the EFEM.

Furthermore, the EFEM may further include: at least one first chamber provided between the transfer chamber and an outside of the EFEM, and configured such that a pressure therein is maintained lower than a lower pressure from among a pressure inside the transfer chamber and a pressure outside the EFEM; and a plurality of second chambers provided between the first chamber and the outside of the EFEM, wherein a pressure inside an outermost second chamber from among the second chambers may be maintained lower than that outside the EFEM.

Furthermore, the EFEM may further include: at least one first chamber provided between the transfer chamber and an outside of the EFEM, and configured such that a pressure therein is maintained lower than a lower pressure from among a pressure inside the transfer chamber and a pressure outside the EFEM; and a second chamber provided between the first chamber and the transfer chamber, wherein a pressure inside the second chamber may be maintained lower than that inside the transfer chamber.

Furthermore, the EFEM may further include: at least one first chamber provided between the transfer chamber and an outside of the EFEM, and configured such that a pressure therein is maintained lower than a lower pressure from among a pressure inside the transfer chamber and a pressure outside the EFEM; and a plurality of second chambers provided between the first chamber and the transfer chamber, wherein a pressure inside an innermost second chamber from among the second chambers may be maintained lower than that inside the transfer chamber.

According to another aspect of the present disclosure, there is provided an equipment front end module (EFEM), including: a transfer chamber in which wafers are transferred between a wafer storage device and process equipment; a first chamber surrounding the transfer chamber at a position outside the transfer chamber; a transfer chamber supply part supplying gas to the transfer chamber; a transfer chamber exhaust part exhausting gas inside the transfer chamber; a first chamber exhaust part exhausting gas inside the first chamber; and a controller controlling an operation of at least one of the transfer chamber supply part, the transfer chamber exhaust part, and the first chamber exhaust part so that a pressure inside the first chamber is maintained lower than that inside the transfer chamber.

Furthermore, the EFEM may further include: a second chamber surrounding the first chamber at a position outside the first chamber; and a second chamber supply part supplying gas to the second chamber, wherein the transfer chamber supply part may communicate with the second chamber, and the controller may control an operation of at least one of the first chamber exhaust part and the second chamber supply part so that the pressure inside the first chamber may be maintained lower than that inside the second chamber.

Furthermore, the controller may control an operation of at least one of the second chamber supply part, the transfer chamber supply part, and the transfer chamber exhaust part so that the pressure inside the second chamber may be maintained higher than that inside the transfer chamber.

Furthermore, the EFEM may further include: a first opening allowing connection of a FOUP of the wafer storage device to the transfer chamber; a first door provided in the transfer chamber so as to open and close an inside of the first opening; and a first communication part openably provided in the first chamber, and configured, when an outside of the first opening is closed by a load port door of a load port for loading the wafer storage device and the inside of the first opening is closed by the first door, to allow communication of a space between the load port door and the first door with the first chamber by opening.

Furthermore, the EFEM may further include: a second chamber surrounding the first chamber at a position outside the first chamber; a second door openably provided between the first chamber and the second chamber so as to close a space between the first chamber and the second chamber in the first opening; and a second communication part openably provided in the second chamber, and configured, when the load port door, the first door, and the second door are closed, to allow communication of a space between the load port door and the second door in the first opening with the second chamber by opening.

Furthermore, the EFEM may further include: a second opening allowing connection of a load lock chamber of the process equipment to the transfer chamber; a third door provided in the transfer chamber so as to open and close an inside of the second opening; and a third communication part openably provided in the first chamber, and configured, when an outside of the second opening is closed by a load lock chamber door of the load lock chamber of the process equipment and the inside of the second opening is closed by the third door, to allow communication of a space between the load lock chamber door and the third door with the first chamber by opening.

Furthermore, the EFEM may further include: a second chamber surrounding the first chamber at a position outside the first chamber; a fourth door openably provided between the first chamber and the second chamber so as to close a space between the first chamber and the second chamber in the second opening; and a fourth communication part openably provided in the second chamber, and configured, when the load lock chamber door, the third door, and the fourth door are closed, to allow communication of a space between the load lock chamber door and the fourth door in the second opening with the second chamber by opening.

Furthermore, the EFEM may further include: a first opening allowing connection of a FOUP of the wafer storage device to the transfer chamber; and a first gap exhaust part provided in a vicinity of the first opening so that gas escaping through a gap between the FOUP and the first opening flows into the first chamber.

Furthermore, the EFEM may further include: a second opening allowing connection of a load lock chamber of the process equipment to the transfer chamber; and a second gap exhaust part provided in a vicinity of the second opening so that gas escaping through a gap between the load lock chamber and the second opening flows into the first chamber.

The EFEM according to the present disclosure as described above has the following effects.

By surrounding the outside of the transfer chamber with the first chamber in which the pressure therein is maintained at a low pressure, it is possible to effectively prevent harmful gases inside the transfer chamber from escaping out of the EFEM.

By surrounding the outside of the first chamber with the second chamber in which the pressure therein is maintained at a high pressure, it is possible to effectively prevent external air from flowing into the transfer chamber.

By surrounding the outside of the transfer chamber with the first chamber in which the pressure therein is maintained at a high pressure, it is possible to effectively prevent harmful gases inside the transfer chamber from escaping out of the EFEM.

By surrounding the outside of the first chamber with the second chamber in which the pressure therein is maintained at a low pressure, it is possible to effectively prevent external air from flowing into the transfer chamber.

Through the first and second doors and the first and second communication parts, when the connection of the wafer storage device to the EFEM is released, even in a region where the first opening exists, it is possible to prevent harmful gases inside the transfer chamber from escaping out of the EFEM, while blocking external air from flowing into the transfer chamber.

Through the third and fourth doors and the third and fourth communication parts, when the connection of the process equipment to the EFEM is released, even in a region where the second opening exists, it is possible to prevent harmful gases inside the transfer chamber from escaping out of the EFEM, while blocking external air from flowing into the transfer chamber.

As the first gap exhaust part and the second gap exhaust part are provided, it is possible to not only effectively prevent escape of gas through the gap between the FOUP and the first opening and escape of gas through the gap between the load lock chamber and the second opening, and but also to easily control the pressure inside the first chamber.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Contents of the description below merely exemplify the principle of the present disclosure. Therefore, those of ordinary skill in the art may implement the theory of the disclosure and invent various apparatuses which are included within the concept and the scope of the disclosure even though it is not clearly explained or illustrated in the description. Furthermore, in principle, all the conditional terms and embodiments listed in this description are clearly intended for the purpose of understanding the concept of the disclosure, and one should understand that this disclosure is not limited the exemplary embodiments and the conditions.

The above described objectives, features, and advantages will be more apparent through the following detailed description related to the accompanying drawings, and thus those of ordinary skill in the art may easily implement the technical spirit of the disclosure.

The embodiments of the present disclosure will be described with reference to sectional views and/or perspective views which schematically illustrate ideal embodiments of the present disclosure. Thus, the embodiments should not be construed as limited to the particular shapes of regions illustrated herein but are to include deviations in shapes that result, for example, from manufacturing.

An EFEM according to the present disclosure is characterized in that the EFEM includes a transfer chamber in which wafers are transferred between a wafer storage device and process equipment, and there is no direct gas flow between the transfer chamber and the vicinity of the EFEM.

In the EFEM, gas inside the transfer chamber is blocked from escaping out of the EFEM.

In addition, in the EFEM, external gas outside the EFEM is blocked from flowing into the transfer chamber.

In order to implement the EFEM as above, the EFEM may include at least one chamber that is provided between the transfer chamber and the outside of the EFEM, and is configured to block gas inside the transfer chamber from escaping out of the EFEM while blocking external gas outside the EFEM from flowing into the transfer chamber.

In this case, the EFEM may include at least one chamber that is provided between the transfer chamber and the outside of the EFEM, and is configured such that the pressure therein is maintained lower than a lower pressure from among the pressure inside the transfer chamber and the pressure in the vicinity of the EFEM.

EFEM 10 According to a First Embodiment of the Present Disclosure

Hereinafter, an EFEM 10 according to the first embodiment of the present disclosure will be described with reference to FIGS. 1 to 5C.

Figure 1:
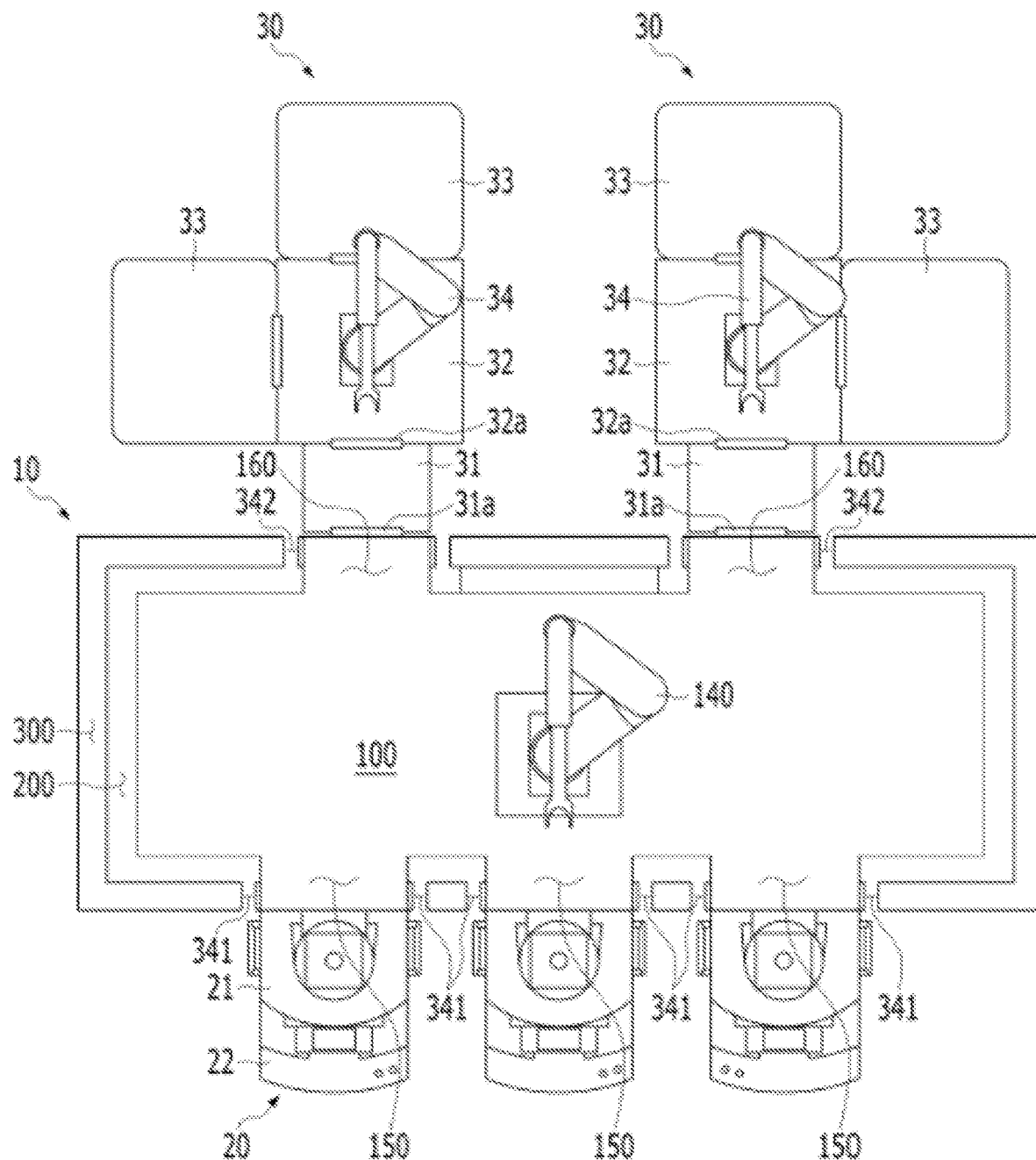
FIG. 1 is a schematic plan view illustrating that a wafer storage device is connected to a front side of an EFEM according to a first embodiment of the present disclosure, and process equipment is connected to a rear side thereof.
Figure 2:
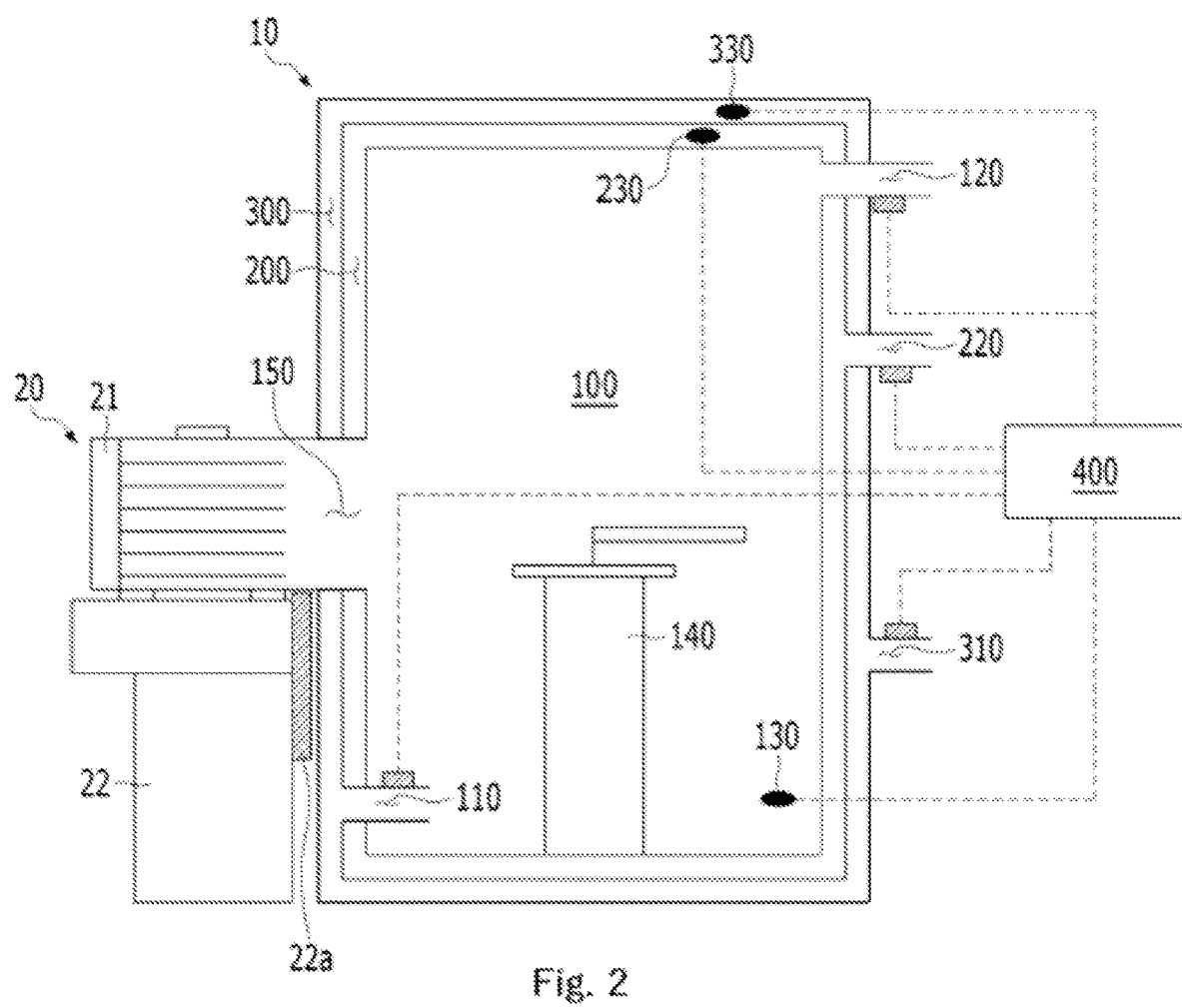
FIG. 2 is a side sectional view illustrating the EFEM according to the first embodiment of the present disclosure.
Figure 3:
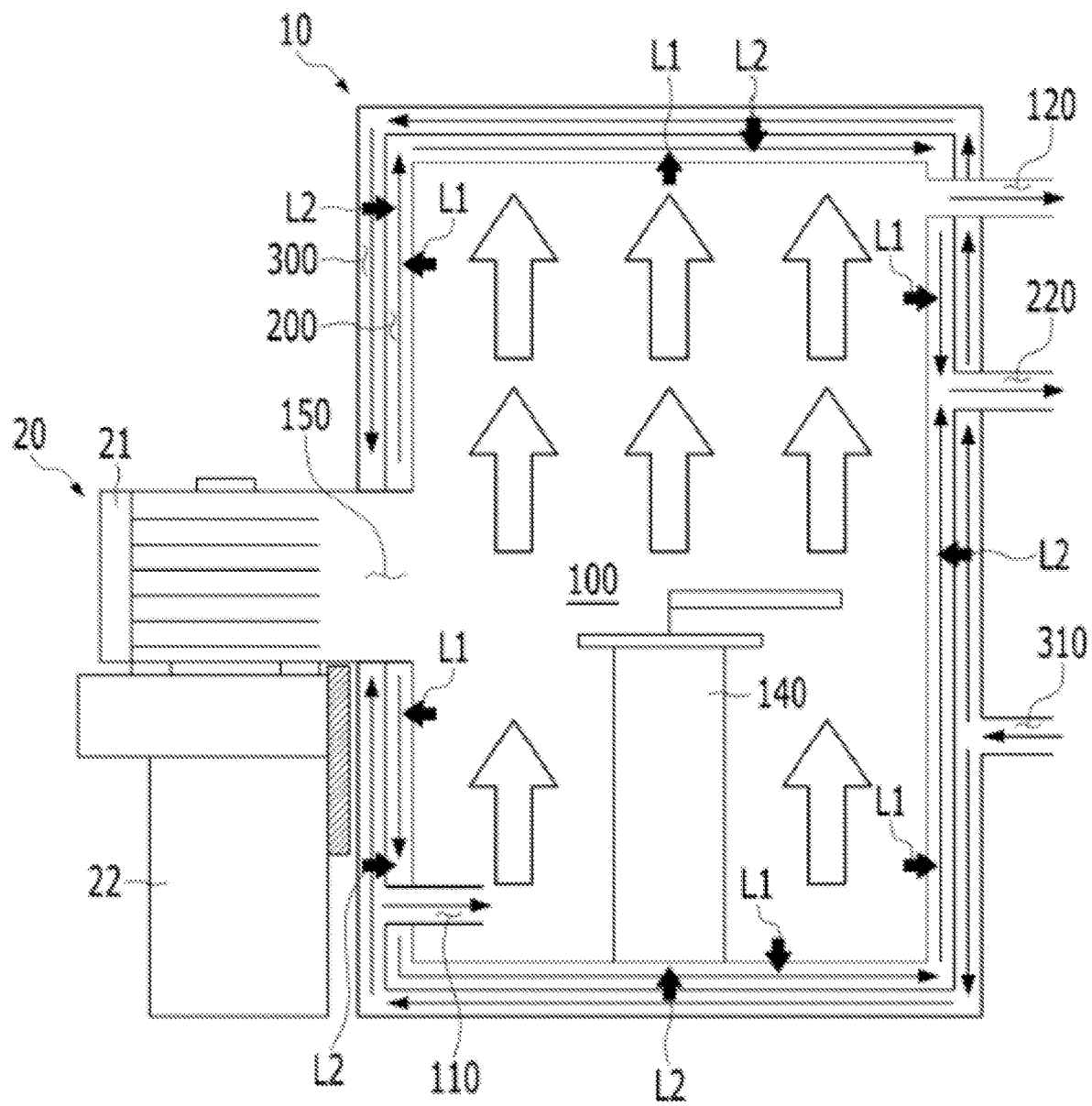
FIG. 3 is a side sectional view illustrating the flow of gas in a transfer chamber, a first chamber, and a second chamber of the EFEM according to the first embodiment of the present disclosure.
Figure 4:
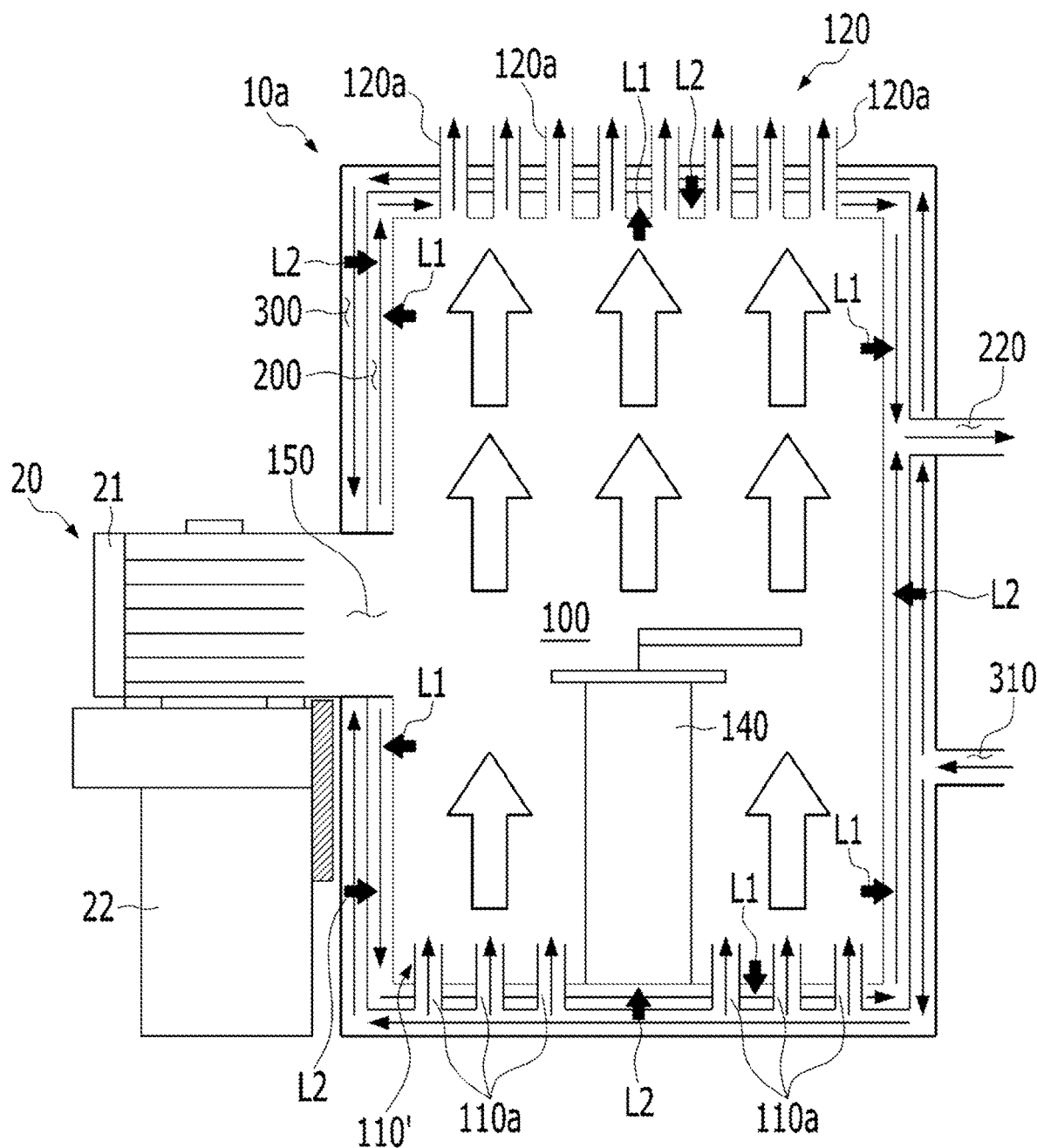
FIG. 4 is a side sectional view illustrating the flow of gas in the transfer chamber, the first chamber, and the second chamber of the EFEM according to the first embodiment of the present disclosure, in which a transfer chamber supply portion and a transfer chamber exhaust portion are modified.
Figure 5:
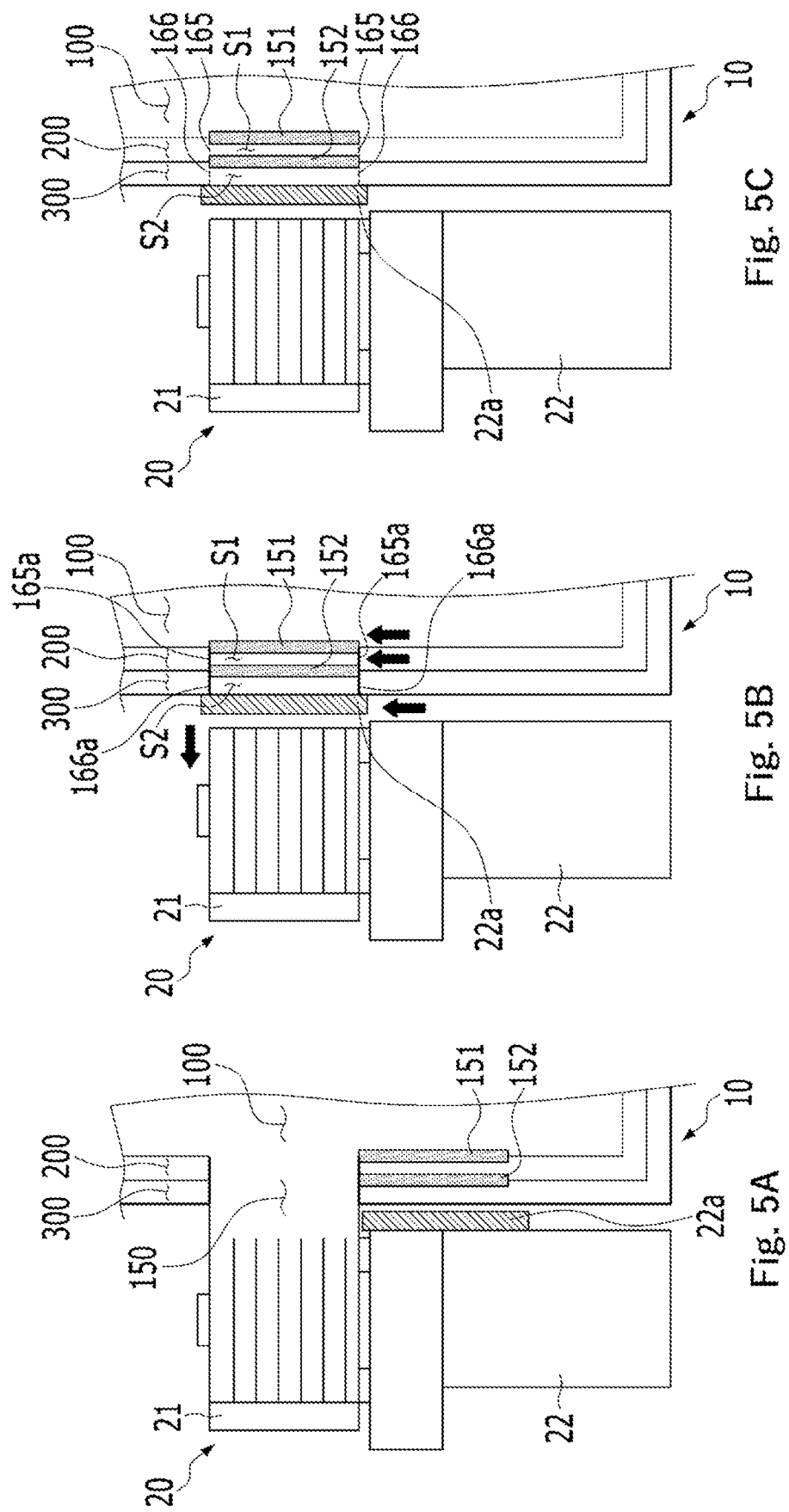
FIGS. 5A to 5C are views illustrating the operations of a load port door, first and second doors, and first and second communication portions when connection of the wafer storage device connected to the EFEM according to the first embodiment of the present disclosure is released.

FIG. 1 is a schematic plan view illustrating that a wafer storage device is connected to a front side of an EFEM according to a first embodiment of the present disclosure, and process equipment is connected to a rear side thereof; FIG. 2 is a side sectional view illustrating the EFEM according to the first embodiment of the present disclosure; FIG. 3 is a side sectional view illustrating the flow of gas in a transfer chamber, a first chamber, and a second chamber of the EFEM according to the first embodiment of the present disclosure; FIG. 4 is a side sectional view illustrating the flow of gas in the transfer chamber, the first chamber, and the second chamber of the EFEM according to the first embodiment of the present disclosure, in which a transfer chamber supply portion and a transfer chamber exhaust portion are modified; and FIGS. 5A to 5C are views illustrating the operations of a load port door, first and second doors, and first and second communication portions when connection of the wafer storage device connected to the EFEM according to the first embodiment of the present disclosure is released.

The EFEM 10 according to the first embodiment of the present disclosure may include: a transfer chamber 100 in which wafers are transferred between a wafer storage device 20 and process equipment 30; a first opening 150 for allowing connection of a FOUP 21 of the wafer storage device 20 to the transfer chamber 100; a second opening 160 for allowing connection of a load lock chamber 31 of the process equipment to the transfer chamber 100; a first chamber 200 surrounding the transfer chamber 100 at a position outside the transfer chamber 100; a transfer chamber supply part 110 for supplying gas to the transfer chamber 100; a transfer chamber exhaust part 120 for exhausting gas inside the transfer chamber 100; a first chamber exhaust part 220 for exhausting gas inside the first chamber 200; a second chamber 300 surrounding the first chamber 200 at a position outside the first chamber 200; a second chamber supply part 310 for supplying gas to the second chamber 300; a second chamber exhaust part (not illustrated) for exhausting gas inside the second chamber 300; and a controller 400 for allowing the pressure inside the first chamber 200 to be maintained lower than that inside the transfer chamber 100 and that inside the second chamber 300.

In the EFEM 10 according to the first embodiment of the present disclosure, the pressure inside the first chamber 200 is maintained lower than that inside the transfer chamber 100 and that in the vicinity of the EFEM 10, so that gas inside the transfer chamber 100 is blocked from escaping out in the vicinity of the EFEM 10.

The first chamber 200 is provided outside the transfer chamber 100 to surround at least a part of a transfer chamber-defining surface of the EFEM 10.

In order to block gas inside the transfer chamber 100 from escaping out in the vicinity the EFEM 10 while blocking external gas in the vicinity of the EFEM 10 from flowing into the transfer chamber 100, the transfer chamber 100 becomes a gaseous sealed space with the vicinity of the EFEM 10 so that gas exchange between the transfer chamber 100 and the vicinity of the EFEM 10 does not occur.

Gas supplied into the transfer chamber 100 for maintaining the pressure inside the transfer chamber 100 flows into the transfer chamber 100 separately from external gas in the vicinity of the EFEM 10.

Gas exhausted out of the transfer chamber 100 for maintaining the pressure inside the transfer chamber 100 is exhausted out of the transfer chamber 100 separately from external gas in the vicinity of the EFEM 10.

Gas flow inside the transfer chamber 100 may flow in an upstream manner from a lower portion of the transfer chamber 100 toward an upper portion of the transfer chamber 100. In this case, gas may be supplied into the transfer chamber 100 by a plurality of supply holes 110a formed in the lower portion of the transfer chamber 100. In addition, gas may be exhausted out of the transfer chamber 100 by a plurality of exhaust holes 120a formed in the upper portion of the transfer chamber 100.

Hereinafter, the EFEM 10 according to the first embodiment of the present disclosure will be described in more detail.

First, the wafer storage device 20 and the process equipment 30 connected to the EFEM 10 will be described.

The gas inside the EFEM 10 denotes all gases inside the EFEM 10 including an inert gas which will be described later. The inert gas denotes gas such as nitrogen, argon, or the like.

A plurality of wafer storage devices 20 is arranged in connection to a front surface of the EFEM 10.

Each of the wafer storage devices 20 includes a FOUP 21 for storing a wafer, and a load port 22 on which the FOUP 21 is coupled and loaded.

The FOUP 21 is open at a side thereof, and a plurality of wafers is received through the open side and stored in a vertical arrangement in the FOUP 21. Therefore, when the wafers are transferred during each process in a wafer manufacturing process, the wafers can be easily transferred through the FOUP 21.

The FOUP 21 is coupled and loaded on the load port 22. Therefore, when the load port 22 is installed on the front surface of the EFEM 10, the open side of the FOUP 21 communicates with the first opening 150 formed in a front surface of the transfer chamber 100, whereby the FOUP 21 of the wafer storage device 20 and the transfer chamber 100 communicate with and are connected to each other.

When the FOUP 21 and the load port 22 are coupled to each other, gas is supplied into the FOUP 21 through a gas delivery part of the load port 22, whereby cleanliness of the wafers stored in the FOUP 21 is managed separately.

A load port door 22a is provided in the load port 22 to close the outside of the first opening 150.

The load port door 22a is opened when the FOUP 21 is connected to the transfer chamber 100 so that the open side of the FOUP 21 and the first opening 150 can easily communicate with each other.

The load port door 22a is closed, when the connection between the FOUP 21 and the transfer chamber 100 is released, to close the outside of the first opening 150, so that external air is prevented from entering the transfer chamber 100, or gas in the transfer chamber 100 is prevented from escaping out of the EFEM 10.

The process equipment 30 is connected to a rear surface of the EFEM 10. In this case, the load lock chamber 31 of the process equipment 30 communicates with the second opening 160 formed in a rear surface of the transfer chamber 100, so that the process equipment 30 communicates and is connected to the rear surface of the EFEM 10.

A plurality of process equipment 30 may be connected to the rear surface of the EFEM 10, and the process equipment 30 may have various configurations.

For example, the process equipment 30 is configured such that a process equipment transfer chamber 32 is installed adjacent to the load lock chamber 31, and a plurality of process units 33 processing wafers is installed adjacent to the process equipment transfer chamber 32.

A load lock chamber door 31a may be installed between the load lock chamber 31 and a rear wall of the transfer chamber 100. By opening and closing operation of the load lock chamber door 31a, the transfer chamber 100 and the load lock chamber 31 can communicate with or can block each other.

The load lock chamber door 31a is opened when the load lock chamber 31 is connected to the transfer chamber 100 so that an open side of the load lock chamber 31 and the second opening 160 can easily communicate with each other.

The load lock chamber door 31a is closed, when the connection between the load lock chamber 31 and the transfer chamber 100 is released, to close the outside of the second opening 160, so that external air is prevented from entering the transfer chamber 100, or gas in the transfer chamber 100 is prevented from escaping out of the EFEM 10.

A process equipment transfer chamber door 32a may be installed between the process equipment transfer chamber 32 and each of the process units 33. By opening operation of the respective process equipment transfer chamber doors 32a, the process equipment transfer chamber 32 and the plurality of process units 33 can communicate with or can block each other.

The process equipment transfer chamber 32 may be provided with a process equipment transfer device 34, so that wafer transfer is performed between the load lock chamber 31 and the plurality of process units 33 by using the process equipment transfer device 34.

Hereinafter, the transfer chamber 100 of the EFEM 10 according to the first embodiment of the present disclosure will be described.

As illustrated in FIGS. 1 and 2, the transfer chamber 100 functions to provide a space in which wafer transfer is performed between the wafer storage devices 20 connected to the front surface of the EFEM 10 and the process equipment 30 connected to the rear surface of the EFEM 10.

Such wafer transfer is performed by a transfer device 140 installed in the transfer chamber 100.

The first chamber 200 is provided outside the transfer chamber 100, and the second chamber 300 is provided outside the first chamber 200.

Therefore, the transfer chamber 100 has a shape surrounded by the first chamber 200, and the first chamber 200 has shape surrounded by the second chamber 300.

In other words, the first chamber 200 has shape surrounding the transfer chamber 100, and the second chamber 300 has a shape surrounding the first chamber 200.

The first opening 150 for allowing connection of the FOUP 21 of the wafer storage device 20 thereto is provided in the front surface of the transfer chamber 100.

The first opening 150 functions to allow connection of the FOUP 21 of the wafer storage device 20 to the transfer chamber 100.

A plurality of first openings 150 may be provided, and the number of the first openings 150 is the same as that of the wafer storage devices 20.

The second opening 160 for allowing connection of the load lock chamber 31 of the process equipment 30 thereto is provided in the rear surface of the transfer chamber 100.

The second opening 160 functions to allow connection of the load lock chamber 31 of the process equipment 30 to the transfer chamber 100.

A plurality of second openings 160 may be provided, and the number of the second openings 160 is the same as that of the process equipment 30.

As the first and second openings 150 and 160 are provided in the front and rear surfaces of the transfer chamber 100, an area of the transfer chamber 100 except for the first and second openings 150 and 160 is surrounded by the first chamber 200 and the second chamber 300. In other words, the first and second chambers 200 and 300 surround an area of the outside of the transfer chamber 100 except for the first and second openings 150 and 160.

This is because the FOUP 21 of the wafer storage device 20 is required to communicate with the transfer chamber 100 through the first opening 150 and because the load lock chamber 31 of the process equipment 30 is required to communicate with the transfer chamber 100 through the second opening 160.

The transfer chamber 100 includes the transfer chamber supply part 110 for supplying gas into the transfer chamber 100, and the transfer chamber exhaust part 120 for exhausting gas inside the transfer chamber 100.

The transfer chamber supply part 110 communicates with the second chamber 300.

The transfer chamber supply part 110 functions to supply gas supplied from an external supply part through the second chamber supply part 310 into the transfer chamber 100 through the second chamber 300.

The gas supplied by the transfer chamber supply part 110 may include an inert gas such as nitrogen.

The transfer chamber exhaust part 120 functions to exhaust gas and foreign substances inside the transfer chamber 100. The gas inside the transfer chamber 100 includes gas supplied by the transfer chamber supply part 110 and fumes generated from the wafers.

Therefore, the transfer chamber exhaust part 120 functions to exhaust gas supplied by the transfer chamber supply part 110 and fumes generated from the wafers.

As illustrated in FIGS. 1 to 3, the transfer chamber supply part 110 is provided at the lower portion of the transfer chamber 100 to supply gas in a direction from the lower portion to the upper portion of the transfer chamber 100, and the transfer chamber exhaust part 120 is provided at the upper portion of the transfer chamber 100 to exhaust gas in a direction from the lower portion to the upper portion of the transfer chamber 100.

A transfer chamber sensor 130 for sensing the pressure inside the transfer chamber 100 is provided inside the transfer chamber 100.

As illustrated in FIG. 4, the EFEM according to the first embodiment of the present disclosure may be implemented as an EFEM 10a in a form in which a transfer chamber supply part and a transfer chamber exhaust part are modified.

In this modified form of the EFEM 10a, the transfer chamber supply part may be comprised of a plurality of supply holes 110a formed in a lower inner surface of the transfer chamber 100, and the transfer chamber exhaust part may be comprised of a plurality of exhaust holes 110a formed in an upper inner surface of the transfer chamber 100.

The plurality of supply holes 110a is provided in the lower inner surface of the transfer chamber 100 to allow supply of gas into the transfer chamber 100 in a form in which gas is supplied from a surface.

The plurality of exhaust holes 120a is provided in the upper inner surface of the transfer chamber 100 to allow exhaust of gas from inside the transfer chamber 100 to outside the transfer chamber 100 in a form in which gas is exhausted from a surface.

As above, as the plurality of supply holes 110a and the plurality of exhaust holes 120a are provided, an updraft of gas is created inside the transfer chamber 100. Therefore, gas flow inside the transfer chamber 100 flows in an upstream manner.

As such, gas is exhausted through the plurality of exhaust holes 120a along with fumes of the wafers, so that cleanliness of the transfer chamber 100 is managed.

On the other hand, the transfer chamber supply part may be provided in an upper portion of the transfer chamber 100, with a fan filter unit (FFU), and the transfer chamber exhaust part may be provided in a lower portion of the transfer chamber 100 to allow exhaust of gas supplied from the upper portion, so that gas may be supplied and exhausted through a downdraft. In other words, gas flow inside the transfer chamber 100 may flow in a downstream manner through the transfer chamber supply part.

Hereinafter, the first chamber 200 and the second chamber 300 of the EFEM 10 according to the first embodiment of the present disclosure will be described.

The first chamber 200 is disposed to surround the transfer chamber 100 at a position outside the transfer chamber 100.

By the controller 400, the pressure inside the first chamber 200 is maintained lower than that inside the transfer chamber 100 and that inside the second chamber 300.

As above, as the pressure inside the first chamber 200 is maintained lower than that inside the transfer chamber 100 and that inside the second chamber 300, gas escaping from the transfer chamber 100 due to a leak and gas escaping from the second chamber 300 flow into the first chamber 200.

The first chamber exhaust part 220 functions to exhaust gas inside the first chamber 200. Therefore, gas inside the first chamber 200 is exhausted out of the EFEM 10 by the first chamber exhaust part 220.

The second chamber 300 is disposed to surround the first chamber 200 at a position outside the first chamber 200.

The second chamber supply part 310 functions to supply gas supplied from the external supply part to the second chamber 300.

The second chamber exhaust part may be provided in the second chamber 300. The second chamber exhaust part functions to exhaust gas inside the second chamber 300. Therefore, the controller 400 controls the pressure inside the second chamber 300 by controlling the second chamber supply part 310 and the second chamber exhaust part.

The second chamber supply part 310 and the second chamber exhaust part may be integrally formed. In other words, the second chamber supply part 310 and the second chamber exhaust part may be configured such that gas is selectively supplied and exhausted through one pipe.

By the controller 400, the pressure inside the second chamber 300 is maintained higher than that inside the transfer chamber 100 and that inside the first chamber 200. This is because high-pressure gas is continuously supplied to the second chamber 300 by the second chamber supply part 310, so that the high-pressure gas flows inside the second chamber 300.

The transfer chamber 100, the first chamber 200, and the second chamber 300 are configured as separate independent spaces.

Therefore, the EFEM 10 has a triple-wall structure in which the first chamber 200 surrounds the outside of the transfer chamber 100 while the second chamber 300 surrounds the outside of the first chamber 200.

Gas flowing through an updraft, and fumes of the wafers flow inside the transfer chamber 100.

Gas and fumes escaping from the transfer chamber 100 and gas escaping from the second chamber 300 flow inside the first chamber 200.

High-pressure gas supplied by the second chamber supply part 310 flows inside the second chamber 300.

A first chamber sensor 230 for sensing the pressure inside the first chamber 200 is provided inside the first chamber 200.

A second chamber sensor 330 for sensing the pressure inside the second chamber 300 is provided inside the second chamber 300.

Hereinafter, the controller 400 of the EFEM 10 according to the first embodiment of the present disclosure will be described.

The controller 400 functions to control the pressure inside each of the transfer chamber 100, the first chamber 200, and the second chamber 300 of the EFEM 10.

It is preferable that the pressure inside each of the transfer chamber 100, the first chamber 200, and the second chamber 300 controlled by the controller 400 satisfies a relationship of 'the pressure inside the second chamber 300> the pressure inside the transfer chamber 100 > the pressure inside the first chamber 200'.

The controller 400 is connected to the transfer chamber sensor 130, the first chamber sensor 230, the second chamber sensor 330, the transfer chamber supply part 110, the second chamber supply part 310, the transfer chamber exhaust part 120, the first chamber exhaust part 220, and the second chamber exhaust part.

The controller 400 controls the operation of at least one of the transfer chamber supply part 110, the transfer chamber exhaust part 120, and the first chamber exhaust part 220 so that the pressure inside the first chamber 200 is maintained lower than that inside the transfer chamber 100.

The controller 400 controls the operation of at least one of the first chamber exhaust part 220, the second chamber supply part 310, and the second chamber exhaust part so that the pressure inside the first chamber 200 is maintained lower than that inside the second chamber 300.

In the controller 400, a first set pressure range, a second set pressure range, and a third set pressure range are preset.

The first set pressure range is a pressure range value that is a reference for the pressure inside the transfer chamber 100 measured by the transfer chamber sensor 130, the second set pressure range is a pressure range value that is a reference for the pressure inside the first chamber 200 measured by the first chamber sensor 230, and the third set pressure range is a pressure range value that is a reference for the pressure inside the second chamber 300 measured by the second chamber sensor 330.

Therefore, the first set pressure range, the second set pressure range, and the third set pressure range satisfy a relationship of 'the third set pressure range > the first set pressure range > the second set pressure range'.

In addition, it is preferable that the pressure inside each of the first chamber 200 and the second chamber 300 and the pressure outside the EFEM 10 satisfy a relationship of 'the pressure inside the second chamber 300 > the pressure outside the EFEM 10 > the pressure inside the transfer chamber 100 > the pressure inside the first chamber 200'.

Therefore, the first set pressure range, the second set pressure range, the third set pressure range, and the pressure outside the EFEM 10 satisfy a relationship of 'the third set pressure range > the pressure outside the EFEM 10 > the first set pressure range > the second set pressure range'.

As above, as the pressure inside the transfer chamber 100 is lower than that outside the EFEM 10, the pressure inside the transfer chamber 100 is maintained lower than that in the vicinity of the EFEM 10, so that gas inside the transfer chamber 100 is blocked from escaping out in the vicinity of the EFEM 10.

The controller 400 controls at least one of the transfer chamber supply part 110 and the transfer chamber exhaust part 120 so that the pressure inside the transfer chamber 100 measured by the transfer chamber sensor 130 falls within the first set pressure range.

The controller 400 controls the first chamber exhaust part 220 so that the pressure inside the first chamber 200 measured by the first chamber sensor 230 falls within the second set pressure range.

The controller 400 controls at least one of the second chamber supply part 310 and the second chamber exhaust part so that the pressure inside the second chamber 300 measured by the second chamber sensor 330 falls within the third set pressure range.

Hereinafter, a method of controlling the pressure inside the transfer chamber 100, the pressure inside the first chamber 200, and the pressure inside the second chamber 300 by the controller 400 will be described with reference to FIGS. 2 and 3.

The controller 400 controls the second chamber supply part 310 in communication with the external supply part to allow supply of gas from the external supply part into the second chamber 300.

In this case, the gas supplied by the external supply part and the second chamber supply part 310 is supplied at a high pressure.

The gas supplied into the second chamber 300 flows inside the second chamber 300, so that the inside of the second chamber 300 is filled with high-pressure gas.

Therefore, fundamentally, the pressure inside the second chamber 300 is higher than that inside the first chamber 200 and that inside the transfer chamber 100.

In addition, the controller 400 controls at least one of the second chamber supply part 310 and the second chamber exhaust part so that the pressure inside the second chamber 300 measured by the second chamber sensor 330 falls within the third set pressure range, whereby the pressure inside the second chamber 300 is maintained higher than that inside the first chamber 200 and that inside the transfer chamber 100.

The controller 400 controls the transfer chamber supply part 110 in communication with the second chamber 300 to allow supply of gas from the second chamber 300 into the transfer chamber 100.

The controller 400 controls the transfer chamber exhaust part 120 to allow exhaust of gas inside the transfer chamber 100. Therefore, the gas supplied into the transfer chamber 100 forms an updraft, and is exhausted out of the EFEM 10 through the transfer chamber exhaust part 120 along with fumes generated from the wafers.

As above, as high-pressure gas is supplied into and exhausted out of the transfer chamber 100, cleanliness of the transfer chamber 100 is managed.

In the first chamber 200, the controller 400 controls the first chamber exhaust part 220 so that the pressure inside the first chamber 200 measured by the first chamber sensor 230 falls within the second set pressure range. Therefore, the pressure inside the first chamber 200 is always maintained at a low pressure.

The controller 400 controls the transfer chamber supply part 110 and the transfer chamber exhaust part 120 so that the pressure inside the transfer chamber 100 measured by the transfer chamber sensor 130 falls within the first set pressure range. Therefore, the pressure inside the transfer chamber 100 is always maintained higher than that inside the first chamber 200.

By the control of the controller 400 as above, the pressure inside the transfer chamber 100 is maintained lower than that outside the EFEM 10.

In addition, the controller 400 controls the second chamber supply part 310 and the second chamber exhaust part so that the pressure inside the second chamber 300 measured by the second chamber sensor 330 falls within the third set pressure range. Therefore, the pressure inside the second chamber 300 is always maintained higher than that inside the first chamber 200.

As above, as the pressure inside the first chamber 200 is maintained lower than that inside the transfer chamber 100 and that inside the second chamber 300, as illustrated by an arrow 'L1' in FIG. 3, gas and fumes inside the transfer chamber 100 may unintentionally escape through a fine leak in an outer surface of the transfer chamber 100 and flow into the first chamber 200.

In addition, as illustrated by an arrow 'L2' in FIG. 3, gas and fumes inside the second chamber 300 may unintentionally escape through a fine leak in an inner surface of the second chamber 300 and flow into the first chamber 200.

The fine leak denotes a leak generated due to assembly errors, manufacturing tolerances of parts, etc. when the transfer chamber 100 is formed, or a leak in an assembled portion for each part that is generated when the EFEM 10 is operated, and collectively refers to a leak generated unintentionally.

The reason for the generation of the fine leak is an increase in manufacturing cost. That is, a precise and reproducible manufacturing process is advantageous when manufacturing the transfer chamber 100, but this manufacturing process causes an increase in manufacturing cost. Therefore, when a less precise manufacturing process is used, while manufacturing cost is reduced, unintended fine leaks may be caused.

In the EFEM 10 according to the first embodiment of the present disclosure, by always maintaining the pressure inside the first chamber 200 between the transfer chamber 100 and the second chamber 300 at a low pressure, gas escaping from the transfer chamber 100 and the second chamber 300 is guided to flow into the first chamber 200, and all the gases inside the first chamber 200 are exhausted to the first chamber exhaust part 220. Therefore, the EFEM 10 according to the first embodiment of the present disclosure can effectively prevent harmful gases such as fumes in the transfer chamber 100 from escaping out of the EFEM 10.

In detail, in the case of an EFEM according to the related art, as a transfer chamber of the EFEM is manufactured in a large size, gas inside the transfer chamber escapes through a fine leak of the large transfer chamber of the EFEM, which causes a problem in that harmful gases escape out of the EFEM. Therefore, these harmful gases lead to many problems such as harming the health of workers. In order to solve such problems of the related art as above, the present disclosure employs the concept of using a pressure difference to allow guidance of gas escaping from the transfer chamber 100 to the first chamber 200, which is an exhaust space, and exhausted outside, so that it is possible to effectively prevent escape of harmful gases inside the transfer chamber 100 to outside the EFEM 10.

The EFEM 10 according to the first embodiment of the present disclosure includes a fine leak in the transfer chamber-defining surface, which was not unintended when the transfer chamber 100 is manufactured, so that gas escapes from the inside of the transfer chamber 100 to the first chamber 200, i.e., a low-pressure chamber, through this fine leak.

The transfer chamber 100 may be manufactured by a precise manufacturing process so that there is no fine leak that causes an escape of gas. However, this manufacturing process leads to a rapid increase in manufacturing cost. Therefore, in the present disclosure, even when an unintended fine leak is caused by an imprecise manufacturing process, by using the pressure difference between the chambers, it is possible to prevent the escape of gas, thereby securing both a reduced manufacturing cost and an improved safety of the EFEM 10.

In addition, by disposing the second chamber 300, in which high-pressure gas always flows, to surround the first chamber 200, it is possible to not only prevent harmful gases in the transfer chamber 100 from escaping out, but also effectively prevent atmospheric pressure, i.e., external air outside the EFEM 10, from entering the transfer chamber 100.

In particular, the second chamber 300 is a space in which high-pressure gas always flows, which is formed by using the fact that when gas is supplied from the external supply part, the gas is supplied in a high-pressure state. Therefore, due to the pressure difference, harmful gases in the transfer chamber 100 do not flow into the second chamber 300.

In addition, since gas escaping from the second chamber 300 escapes into the first chamber 200 having a low pressure, the amount of gas escaping from the second chamber 300 out of the EFEM 10 is small. Moreover, even when the gas inside the second chamber 300 escapes out of the EFEM 10, only clean gas flows inside the second chamber 300, so that the outside of the EFEM 10 is not contaminated.

As above, in the EFEM 10 according to the first embodiment of the present disclosure, by the first chamber 200 and the second chamber 300, gas inside the transfer chamber 100 does not escape out of the EFEM 10, and at the same time, gas outside the EFEM 10 does not flow into the transfer chamber 100. Therefore, the space inside the transfer chamber 100 forms a kind of independent space in which gas inflow and outflow with respect to the external space outside the EFEM 10 are blocked.

Each of the above-described transfer chamber supply part 110, transfer chamber exhaust part 120, first chamber exhaust part 220, second chamber supply part 310, and second chamber exhaust part may include a flow controller.

The flow controller is connected to the controller 400.

The controller 400 operates the respective flow controllers according to the pressure inside the transfer chamber 100, the pressure inside the first chamber 200, and the pressure inside the second chamber 300, thereby easily controlling the flow rate of gas supplied or exhausted from the transfer chamber supply part 110, the transfer chamber exhaust part 120, the first chamber exhaust part 220, the second chamber supply part 310, and the second chamber exhaust part.

Hereinafter, a first door 151, a first communication part 165, a second door 152, and a second communication part 166 of the EFEM 10 according to the first embodiment of the present disclosure will be described.

As illustrated FIGS. 1, 2, 5A, 5B, and 5C, the EFEM 10 according to the first embodiment of the present disclosure may further include: the first door 151 provided in the transfer chamber 100 so as to open and close the inside of the first opening 150; the first communication part 165 openably provided in the first chamber 200, and configured, when the outside of the first opening 150 is closed by the load port door 22a of the load port 22 for loading the wafer storage device 20 and the inside of the first opening 150 is closed by the first door 151, to allow communication of a space S1 between the load port door 22a and the first door 151 with the first chamber 200 by opening; the second door 152 openably provided between the first chamber 200 and the second chamber 300 so as to close a space between the first chamber 200 and the second chamber 300 in the first opening 150; and the second communication part 166 openably provided in the second chamber 300, and configured, when the load port door 22a, the first door 151, and the second door 152 are closed, to allow communication of a space S2 between the load port door 22a and the second door 152 in the first opening 150 with the second chamber 300 by opening.

As illustrated in FIGS. 5A to 5C, the first door 151 is provided in the transfer chamber 100 to open and close the inside of the first opening 150.

The second door 152 is openably provided between the first chamber 200 and the second chamber 300 in the first opening 150 so as to close the space between the first chamber 200 and the second chamber 300 in the first opening 150.

The first door 151 and the second door 152 are connected to the controller 400, and function, when the connection between the wafer storage device 20 and the EFEM 10 is released, to close the first opening 150 along with the load port 22a.

The first communication part 165 is openably provided in the first chamber 200, and functions, when the outside of the first opening 150 is closed by the load port door 22a of the load port 22 for loading the wafer storage device 20 and the inside of the first opening 150 is closed by the first door 151, to allow communication of the space between the load port door 22a and the first door 151 with the first chamber 200 by opening.

The second communication part 166 is openably provided in the second chamber 300, and functions, when the load port door 22a, the first door 151, and the second door 152 are closed, to allow communication of the space S2 between the load port door 22a and the second door 152 in the first opening 150 with the second chamber 300 by opening.

When the load port door 22a, the first door 151, and the second door 152 are all closed, the first communication part 165 is opened to allow communication of the space S1 between the first door 151 and the second door 152 with the first chamber 200.

The load port door 22a, the first door 151, the second door 152, the first communication part 165, and the second communication part 166 are connected to the controller 400.

The first communication part 165 includes a first opening/closing means 165a, and the second communication part 166 includes a second opening/closing means 166a.

Hereinafter, operations of the first door 151, the second door 152, the first communication part 165, and the second communication part 166 will be described in detail with reference to FIGS. 5A to 5C.

In a state of FIG. 5A in which the wafer storage device 20 and the EFEM 10 are connected so that the FOUP 21 and the transfer chamber 100 communicate with each other by the first opening 150, as illustrated in FIG. 5B, in order to release the connection between the wafer storage device 20 and the EFEM 10, the FOUP 21 loaded on the load port 22 is moved rearward.

In this case, under control of the controller 400, the load port door 22a closes the outside of the first opening 150, the first door 151 closes the inside of the first opening 150, and the second door 152 closes the space between the first chamber 200 and the second chamber 300 in the first opening 150.

Therefore, as illustrated in FIG. 5B, the first opening 150 is divided into the space S1 between the first door 151 and the second door 152, and the space S2 between the second door 152 and the load port door 22a.

Thereafter, as illustrated in FIG. 5C, the controller 400 controls the first communication part 165 to allow opening of the first opening/closing means 165a, thereby allowing communication of the space S1 between the first door 151 and the second door 152 with the first chamber 200, and controls the second communication part 166 to allow opening of the second opening/closing means 166a, thereby allowing the space S2 between the second door 152 and the load port door 22a with the second chamber 300.

As above, as the load port door 22a, the first door 151, the second door 152, the first communication part 165, and the second communication part 166 are provided, when the connection of the wafer storage device 20 to the EFEM 10 is released, even in a region where the first opening 150 exists, the space S1 between the first door 151 and the second door 152 communicates with the first chamber 200, so that gas escaping from the transfer chamber 100 and the second chamber 300 can be effectively exhausted through the second chamber exhaust part. In addition, even in the region where the first opening 150 exists, the space S2 between the second door 152 and the load port door 22a communicates with the second chamber 300, so that external air can be prevented from flowing into the first chamber 200.

Therefore, in the present disclosure, even when the connection of the wafer storage device 20 is released, it is possible to effectively prevent harmful gases inside the transfer chamber 100 from escaping out of the EFEM 10 in the region of the first opening 150.

Hereinafter, a third door (not illustrated), a third communication part (not illustrated), a fourth door (not illustrated), and a fourth communication part (not illustrated) of the EFEM 10 according to the first embodiment of the present disclosure will be described.

As illustrated FIGS. 1 and 2, the EFEM 10 according to the first embodiment of the present disclosure may further include: the third door provided in the transfer chamber 100 so as to open and close the inside of the second opening 160; the third communication part openably provided in the first chamber 200, and configured, when the outside of the second opening 160 is closed by the load lock chamber door 31a of the load lock chamber 31 of the process equipment 30 and the inside of the second opening 160 is closed by the third door, to allow communication of a space between the load lock chamber door 31a and the third door with the first chamber 200 by opening; the fourth door openably provided between the first chamber 200 and the second chamber 300 so as to close a space between the first chamber 200 and the second chamber 300 in the second opening 160; and the fourth communication part openably provided in the second chamber 300, and configured, when the load lock chamber door 31a, the third door, and the fourth door are closed, to allow communication of a space between the load lock chamber door 31a and the fourth door in the second opening 160 with the second chamber 300 by opening.

The third door is provided in the transfer chamber 100 to open and close the inside of the second opening 160.

The fourth door is openably provided between the first chamber 200 and the second chamber 300 in the second opening 160 so as to close the space between the first chamber 200 and the second chamber 300 in the second opening 160.

The third door and the fourth door are connected to the controller 400, and function, when the connection between the process equipment 30 and the EFEM 10 is released, to close the second opening 160 along with the load lock chamber door 31a.

The third communication part is openably provided in the first chamber 200, and functions, when the outside of the second opening 160 is closed by the load lock chamber door 31a of the load lock chamber 31 of the process equipment 30 and the inside of the second opening 160 is closed by the third door, to allow communication of the space between the load lock chamber door 31a and the third door with the first chamber 200 by opening.

The fourth communication part is openably provided in the second chamber 300, and functions, when the load lock chamber door 31a, the third door, and the fourth door are closed, to allow communication of the space between the load lock chamber door 31a and the fourth door in the second opening 160 with the second chamber 300 by opening.

When the load lock chamber door 31a, the third door, and the second door are all closed, the third communication part is opened to allow communication of the space between the third door and the fourth door with the first chamber 200.

The load lock chamber door 31a, the third door, the fourth door, the third communication part, and the fourth communication part are connected to the controller 400.

The third communication part includes a third opening/closing means, and the fourth communication part includes a fourth opening/closing means.

Hereinafter, operations of the third door, the fourth door, the third communication part, and the fourth communication part will be described in detail.

In a state in which the process equipment 30 and the EFEM are connected so that the load lock chamber 31 and the transfer chamber 100 communicate with each other by the second opening 160, in order to release the connection between the wafer storage device 20 and the EFEM 10, the load lock chamber door 31a closes the outside of the second opening 160.

In this case, the third door closes the inside of the second opening 160, and the fourth door closes the space between the first chamber 200 and the second chamber 300 in the second opening 160.

Therefore, the second opening 160 is divided into a space between the third door and the fourth door and a space between the fourth door and the load lock chamber door 31a.

Thereafter, the controller 400 controls the third communication part to allow opening of the third opening/closing means, thereby allowing communication of the space between the third door and the fourth door with the first chamber 200, and controls the fourth communication part to allow opening of the four opening/closing means, thereby allowing communication of the space between the fourth door and the load lock chamber door 31a with the second chamber 300.

As above, as the load lock chamber door 31a, the third door, the fourth door, the third communication part, and the fourth communication part are provided, when the connection of the process equipment 30 to the EFEM 10 is released, even in a region where the second opening 160 exists, the space between the third door and the fourth door communicates with the first chamber 200, so that gas escaping from the transfer chamber 100 and the second chamber 300 can be effectively exhausted through the second chamber exhaust part. In addition, even in the region where the second opening 160 exists, the space between the fourth door and the load lock chamber door 31a communicates with the second chamber 300, so that external air can be prevented from flowing into the first chamber 200.

Therefore, in the present disclosure, even when the connection of the process equipment 30 is released, it is possible to effectively prevent harmful gases inside the transfer chamber 100 from escaping out of the EFEM 10 in the region of the second opening 160.

Hereinafter, a first gap exhaust part 341 and a second gap exhaust part 342 of the EFEM 10 according to the first embodiment of the present disclosure will be described.

As described above, even when escaped gas is exhausted through the second chamber 300, gas and fumes inside the transfer chamber 100 may escape through a gap between the first opening 150 for allowing connection of the wafer storage device to the EFEM 10, and the FOUP 21 of the wafer storage device 20, and a gap between the load lock chamber 31 for allowing connection of the process equipment 30 to the EFEM 10, and the second opening 160.

Therefore, in order to prevent this, as illustrated in FIG. 1, the EFEM 10 according to the first embodiment of the present disclosure may further include: the first gap exhaust part 341 provided in the vicinity of the first opening 150 so that gas escaping through the gap between the FOUP 21 and the first opening 150 flows into the first chamber 200; and the second gap exhaust part 342 provided in the vicinity of the second opening 160 so that gas escaping through the gap between the load lock chamber 31 and the second opening 160 flows into the first chamber 200.

Hereinafter, the first gap exhaust part 341 and the second gap exhaust part 342 will be described in detail.

The first gap exhaust part 341 is provided in the vicinity of the first opening 150 so as to effectively prevent gas from escaping through the gap between the FOUP 21 and the first opening 150 during the connection of the FOUP 21 of the wafer storage device 20 to the first opening 150.

The first gap exhaust part 341 may be comprised of a plurality of exhaust holes or a plurality of slits arranged in the vicinity of the first opening 150.

The first gap exhaust part 341 communicates with the first chamber 200. Therefore, when a suction force is generated inside the first chamber 200 by the first chamber exhaust part 220, external air and gas that unintentionally escapes through the gap between the FOUP 21 and the first opening 150 flow into the first chamber 200 through the first gap exhaust part 341, and then are exhausted outside through the first chamber exhaust part 220.

The second gap exhaust part 342 is provided in the vicinity of the second opening 160 so as to effectively prevent gas from escaping through the gap between the load lock chamber 31 and the second opening 160 during the connection of the load lock chamber 31 of the process equipment 30 to the second opening 160.

The second gap exhaust part 342 may be comprised of a plurality of exhaust holes or a plurality of slits arranged in the vicinity of the first opening 150.

The second gap exhaust part 342 communicates with the first chamber 200. Therefore, when a suction force is generated inside the first chamber 200 by the first chamber exhaust part 220, external air and gas that unintentionally escapes through the gap between the load lock chamber 31 and the second opening 160 flow into the first chamber 200 through the second gap exhaust part 342, and then are exhausted outside through the first chamber exhaust part 220.

As above, as the first gap exhaust part 341 and the second gap exhaust part 342 are provided, it is possible to not only effectively prevent escape of gas through the gap between the FOUP 21 and the first opening 150 and escape of gas through the gap between the load lock chamber 31 and the second opening 160, and but also to easily control the pressure inside the first chamber 200.

In detail, in a case where only the first chamber exhaust part 220 is provided in the first chamber 200, when exhaust is continuously performed by the first chamber exhaust part 220, the degree of vacuum inside the first chamber 200 increases. This is because when gas escapes from the transfer chamber 100 and the second chamber 300, the gas escapes through a fine leak.

As above, when the degree of vacuum inside the first chamber 200 increases, it is difficult to control the pressure inside the first chamber 200 through the exhaust of the first chamber exhaust part 220. Therefore, it is difficult to maintain the pressure inside the first chamber 200 within the second set pressure range. This requires the first chamber 200 to have a separate hole for communication with external air, etc. The separate hole may perform this function along with the above-described first gap exhaust part 341 and second gap exhaust part 342 communicating with the outside of the EFEM 10.

The above-described EFEM 10 according to the first embodiment of the present disclosure may include: at least one first chamber 200 provided between the transfer chamber 100 and the outside of the EFEM 10, and configured such that the pressure therein is maintained lower than a lower pressure from among the pressure inside the transfer chamber 100 and the pressure outside the EFEM 10; and at least one second chamber 300 provided between the transfer chamber 100 and the outside of the EFEM 10, and configured such that the pressure therein is maintained higher than that inside the first chamber 200.

In addition, the EFEM 10 may include: at least one first chamber 200 provided between the transfer chamber 100 and the outside of the EFEM 10, and configured such that the pressure therein is maintained lower than a lower pressure from among the pressure inside the transfer chamber 100 and the pressure outside the EFEM 10; and a second chamber 300 provided between the first chamber 200 and the outside of the EFEM 10. In this case, the pressure inside the second chamber 300 may be maintained lower than that outside the EFEM 10.

In addition, the EFEM 10 may include: at least one first chamber 200 provided between the transfer chamber 100 and the outside of the EFEM 10, and configured such that the pressure therein is maintained lower than a lower pressure from among the pressure inside the transfer chamber 100 and the pressure outside the EFEM 10; and a plurality of second chambers 300 provided between the first chamber 200 and the outside of the EFEM 10, wherein the pressure inside an outermost second chamber 300 from among the second chambers 300 may be maintained lower than that outside the EFEM 10.

In addition, the EFEM 10 may include: at least one first chamber 200 provided between the transfer chamber 100 and the outside of the EFEM 10, and configured such that the pressure therein is maintained lower than a lower pressure from among the pressure inside the transfer chamber 100 and the pressure outside the EFEM 10; and a second chamber 300 provided between the first chamber 200 and the transfer chamber 100, wherein the pressure inside the second chamber 300 may be maintained lower than that inside the transfer chamber 100.

In addition, the EFEM 10 may include: at least one first chamber 200 provided between the transfer chamber 100 and the outside of the EFEM 10, and configured such that the pressure therein is maintained lower than a lower pressure from among the pressure inside the transfer chamber 100 and the pressure outside the EFEM 10; and a plurality of second chambers 300 provided between the first chamber 200 and the transfer chamber 100, wherein the pressure inside an innermost second chamber 300 from among the second chambers 300 may be maintained lower than that inside the transfer chamber 100.

EFEM 10' According to a Second Embodiment of the Present Disclosure

Hereinafter, an EFEM 10' according to the second embodiment of the present disclosure will be described with reference to FIGS. 6 and 7.

Figure 6:
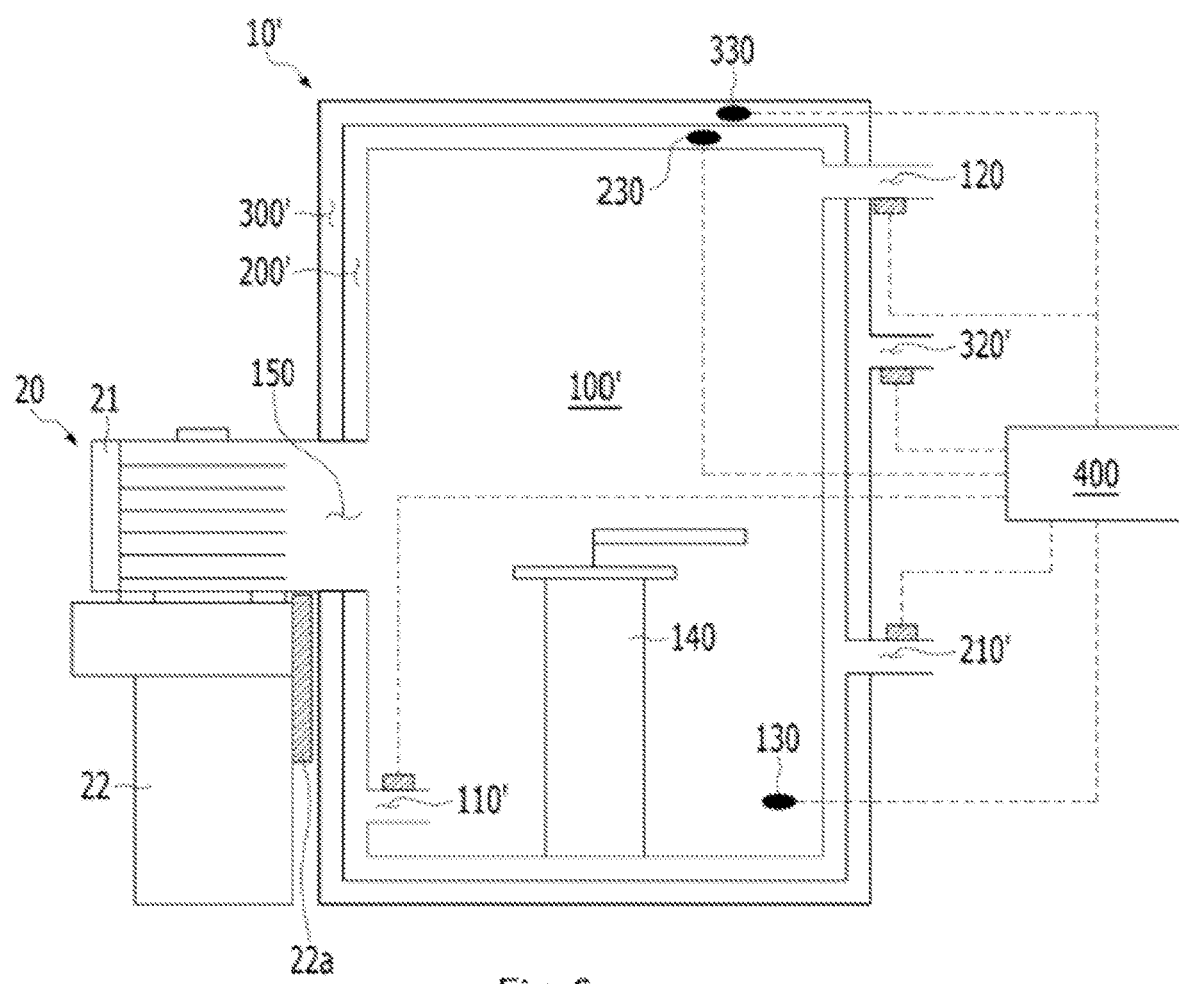
FIG. 6 is a side sectional view illustrating an EFEM according to a second embodiment of the present disclosure.
Figure 7:
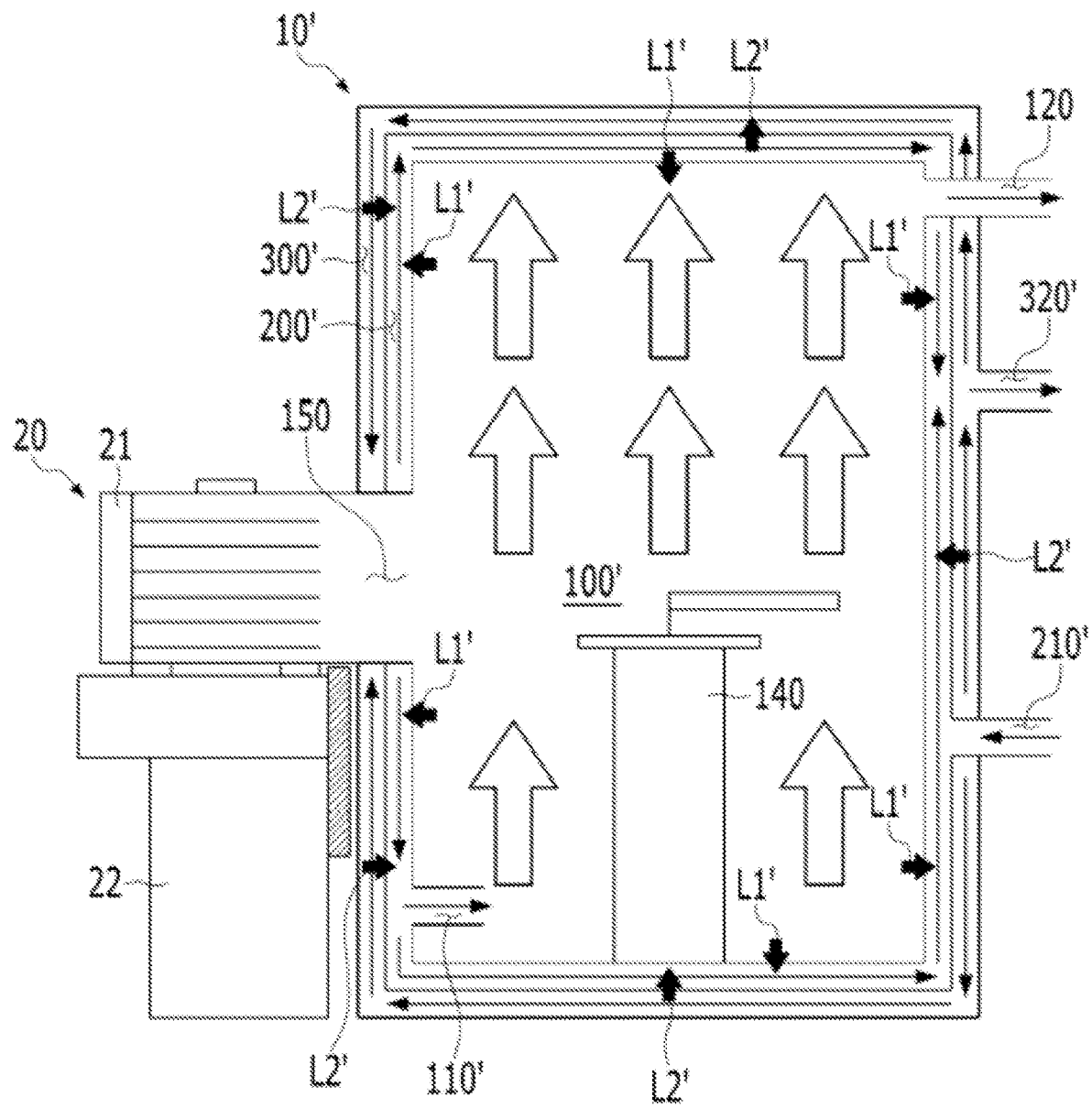
FIG. 7 is a side sectional view illustrating the flow of gas in a transfer chamber, a first chamber, and a second chamber of the EFEM according to the second embodiment of the present disclosure.

FIG. 6 is a side sectional view illustrating an EFEM according to a second embodiment of the present disclosure, and FIG. 7 is a side sectional view illustrating the flow of gas in a transfer chamber, a first chamber, and a second chamber of the EFEM according to the second embodiment of the present disclosure.

As illustrated in FIGS. 6 and 7, the EFEM 10' according to the second embodiment of the present disclosure may include: a transfer chamber 100' in which wafers are transferred between a wafer storage device 20 and process equipment 30; a first opening 150 for allowing connection of a FOUP 21 of the wafer storage device 20 and the transfer chamber 100'; a second opening 160 for allowing connection of a load lock chamber 31 of the process equipment 30 and the transfer chamber 100'; a first chamber 200' surrounding the transfer chamber 100' at a position outside the transfer chamber 100'; a transfer chamber supply part 110' for supplying gas to the transfer chamber 100'; a transfer chamber exhaust part 120 for exhausting gas inside the transfer chamber 100'; a first chamber supply part 210' for supplying gas into the first chamber 200'; a first chamber exhaust part (not illustrated) for exhausting gas inside the first chamber 200'; a second chamber 300' surrounding the first chamber 200' at a position outside the first chamber 200'; a second chamber exhaust part 320' for exhausting gas inside the second chamber 300'; and a controller 400 for allowing the pressure inside the first chamber 200' to be maintained higher than that inside the transfer chamber 100' and that inside the second chamber 300'.

In the EFEM 10' according to the second embodiment of the present disclosure, the pressure inside the first chamber 200' is maintained higher than that inside the transfer chamber 100' and that in the vicinity of the EFEM 10', so that gas inside the transfer chamber 100' is blocked from escaping out in the vicinity of the EFEM 10'.

The first chamber 200' is provided outside the transfer chamber 100' to surround at least a part of a transfer chamber-defining surface of the EFEM 10'.

In order to block gas inside the transfer chamber 100' from escaping out in the vicinity of the EFEM 10' while blocking external gas in the vicinity of the EFEM 10' from flowing into the transfer chamber 100', the transfer chamber 100' becomes a gaseous sealed space with the vicinity of the EFEM 10' so that gas exchange between the transfer chamber 100' and the vicinity of the EFEM 10' does not occur.

Gas supplied into the transfer chamber 100' for maintaining the pressure inside the transfer chamber 100' flows into the transfer chamber 100' separately from external gas in the vicinity of the EFEM 10'.

Gas exhausted out of the transfer chamber 100' for maintaining the pressure inside the transfer chamber 100' is exhausted out of the transfer chamber 100' separately from external gas in the vicinity of the EFEM 10'.

Gas flow inside the transfer chamber 100' may flow in an upstream manner from a lower portion of the transfer chamber 100' toward an upper portion of the transfer chamber 100'. In this case, gas may be supplied into the transfer chamber 100' by a plurality of supply holes 110a formed in the lower portion of the transfer chamber 100'. In addition, gas may be exhausted out of the transfer chamber 100' by a plurality of exhaust holes 120a formed in the upper portion of the transfer chamber 100'.

The EFEM 10' according to the second embodiment of the present disclosure differs from the EFEM 10 according to the first embodiment in that the pressure inside the first chamber 200' is maintained higher than that inside the second chamber 300' and that inside the transfer chamber 100'. Therefore, this difference is mainly described, and the above-description of the EFEM 10 according to the first embodiment of the present disclosure may be applied to the remaining identical configurations.

Hereinafter, the transfer chamber 100' of the EFEM 10' according to the second embodiment of the present disclosure will be described.

As illustrated in FIGS. 6 and 7, the transfer chamber 100' includes the transfer chamber supply part 110' for supplying gas into the transfer chamber 100', and the transfer chamber exhaust part 120 for exhausting gas inside the transfer chamber 100'.

The transfer chamber supply part 110' communicates with the first chamber 200.

The transfer chamber supply part 110' functions to supply gas supplied from an external supply part through the first chamber supply part 210' into the transfer chamber 100' through the first chamber 200'.

The gas supplied by the transfer chamber supply part 110' may include an inert gas such as nitrogen.

The transfer chamber exhaust part 120 functions to exhaust gas and foreign substances inside the transfer chamber 100'. The gas inside the transfer chamber 100' includes gas supplied by the transfer chamber supply part 110' and fumes generated from the wafers.

Therefore, the transfer chamber exhaust part 120 functions to exhaust gas supplied by the transfer chamber supply part 110' and fumes generated from the wafers.

The transfer chamber supply part 110' is provided at the lower portion of the transfer chamber 100' to supply gas in a direction from the lower portion to the upper portion of the transfer chamber 100', and the transfer chamber exhaust part 120 is provided at the upper portion of the transfer chamber 100' to exhaust gas in a direction from the lower portion to the upper portion of the transfer chamber 100'.

A transfer chamber sensor 130 for sensing the pressure inside the transfer chamber 100' is provided inside the transfer chamber 100'.

Hereinafter, the first chamber 200' and the second chamber 300' of the EFEM 10' according to the second embodiment of the present disclosure will be described.

The first chamber 200' is disposed to surround the transfer chamber 100' at a position outside the transfer chamber 100'.

The first chamber supply part 210' functions to supply gas supplied from the external supply part to the first chamber 200'.

The first chamber exhaust part may be provided in the first chamber 200'. The first chamber exhaust part functions to exhaust gas inside the first chamber 200'. Therefore, the controller 400 controls the pressure inside the first chamber 200' by controlling the first chamber supply part 210' and the first chamber exhaust part.

The first chamber supply part 210' and the first chamber exhaust part may be integrally formed. In other words, the first chamber supply part 210' and the first chamber exhaust part may be configured such that gas is selectively supplied and exhausted through one pipe.

By the controller 400, the pressure inside the first chamber 200' is maintained higher than that inside the transfer chamber 100' and that inside the second chamber 300'. This is because high-pressure gas is continuously supplied to the first chamber 200' by the first chamber supply part 210', so that the high-pressure gas flows inside the first chamber 200'.

By the controller 400, the pressure inside the first chamber 200' is maintained higher than that inside the transfer chamber 100' and that inside the second chamber 300'.

As above, as the pressure inside the first chamber 200' is maintained higher than that inside the transfer chamber 100' and that inside the second chamber 300', gas escaping from the transfer chamber 100' due to a leak do not flow into the first chamber 200'.

The second chamber 300' is disposed to surround the first chamber 200' at a position outside the first chamber 200'.

By the controller 400, the pressure inside the second chamber 300' is maintained lower than that inside the transfer chamber 100' and that inside the first chamber 200'.

As above, as the pressure inside the second chamber 300' is maintained lower than that inside the transfer chamber 100' and that inside the first chamber 200', gas escaping from the first chamber 200' due to a leak and gas flowing in from outside the EFEM 10' due to a leak flow inside the second chamber 300'.

The second chamber exhaust part 320' functions to exhaust gas inside the second chamber 300'. Therefore, gas inside the second chamber 300' is exhausted out of the EFEM 10' by the second chamber exhaust part 320'.

The transfer chamber 100', the first chamber 200', and the second chamber 300' are configured as separate independent spaces.

Therefore, the EFEM 10' has a triple-wall structure in which the first chamber 200' surrounds the outside of the transfer chamber 100' while the second chamber 300' surrounds the outside of the first chamber 200'.

Gas flowing through an updraft, and fumes of the wafers flow inside the transfer chamber 100'.

High-pressure gas supplied by the first chamber supply part 210' flows inside the first chamber 200'.

Gas escaping from the first chamber 200' and gas flowing in from outside the EFEM 10' flow inside the second chamber 300'.

A first chamber sensor 230 for sensing the pressure inside the first chamber 200' is provided inside the first chamber 200'.

A second chamber sensor 330 for sensing the pressure inside the second chamber 300' is provided inside the second chamber 300'.

Hereinafter, the controller 400 of the EFEM 10' according to the second embodiment of the present disclosure will be described.

The controller 400 functions to control the pressure inside each of the transfer chamber 100', the first chamber 200', and the second chamber 300' of the EFEM 10'.

It is preferable that the pressure inside each of the transfer chamber 100', the first chamber 200', and the second chamber 300' controlled by the controller 400 satisfies a relationship of 'the pressure inside the first chamber 200'> the pressure inside the transfer chamber 100'> the pressure inside the second chamber 300''.

The controller 400 is connected to the transfer chamber sensor 130, the first chamber sensor 230, the second chamber sensor 330, the transfer chamber supply part 110', the first chamber supply part 210', the transfer chamber exhaust part 120, the first chamber exhaust part, and the second chamber exhaust part 320'.

The controller 400 controls the operation of at least one of the transfer chamber supply part 110', the transfer chamber exhaust part 120, and the first chamber supply part 210' so that the pressure inside the first chamber 200' is maintained higher than that inside the transfer chamber 100'.

The controller 400 controls the operation of at least one of the first chamber supply part 210', the first chamber exhaust part, and the second chamber exhaust part 320' so that the pressure inside the first chamber 200' is maintained higher than that inside the second chamber 300'.

In the controller 400, a first set pressure range, a second set pressure range, and a third set pressure range are preset.

The first set pressure range is a pressure range value that is a reference for the pressure inside the transfer chamber 100' measured by the transfer chamber sensor 130, the second set pressure range is a pressure range value that is a reference for the pressure inside the first chamber 200' measured by the first chamber sensor 230, and the third set pressure range is a pressure range value that is a reference for the pressure inside the second chamber 300' measured by the second chamber sensor 330.

Therefore, the first set pressure range, the second set pressure range, and the third set pressure range satisfy a relationship of 'the second set pressure range > the first set pressure range > the third set pressure range'.

In addition, it is preferable that the pressure inside each of the first chamber 200' and the second chamber 300' and the pressure outside the EFEM 10' satisfy a relationship of 'the pressure inside the first chamber 200'> the pressure outside the EFEM 10'> the pressure inside the transfer chamber 100'> the pressure inside the second chamber 300''.

Therefore, the first set pressure range, the second set pressure range, the third set pressure range, and the pressure outside the EFEM 10' satisfy a relationship of 'the second set pressure range > the pressure outside the EFEM 10'> the first set pressure range > the third set pressure range'.

As above, as the pressure inside the transfer chamber 100' is lower than that outside the EFEM 10', the pressure inside the transfer chamber 100' is maintained lower than that in the vicinity of the EFEM 10', so that gas inside the transfer chamber 100' is blocked from escaping out in the vicinity of the EFEM 10'.

The controller 400 controls at least one of the transfer chamber supply part 110' and the transfer chamber exhaust part 120 so that the pressure inside the transfer chamber 100' measured by the transfer chamber sensor 130 falls within the first set pressure range.

The controller 400 controls at least one of the first chamber supply part 210' and the first chamber exhaust part so that the pressure inside the first chamber 200' measured by the first chamber sensor 230 falls within the second set pressure range.

The controller 400 controls the second chamber exhaust part 320' so that the pressure inside the second chamber 300' measured by the second chamber sensor 330 falls within the third set pressure range.

Hereinafter, a method of controlling the pressure inside the transfer chamber 100', the pressure inside the first chamber 200', and the pressure inside the second chamber 300' by the controller 400 will be described with reference to FIGS. 6 and 7.

The controller 400 controls the first chamber supply part 210' in communication with the external supply part to allow supply of gas from the external supply part into the first chamber 200'.

In this case, the gas supplied by the external supply part and the first chamber supply part 210' is supplied at a high pressure.

The gas supplied into the first chamber 200' flows inside the first chamber 200', so that the inside of the first chamber 200' is filled with high-pressure gas.

Therefore, fundamentally, the pressure inside the first chamber 200' is higher than that inside the second chamber 300' and that inside the transfer chamber 100'.

In addition, the controller 400 controls at least one of the first chamber supply part 210' and the first chamber exhaust part so that the pressure inside the first chamber 200' measured by the first chamber sensor 230 falls within the second set pressure range, whereby the pressure inside the first chamber 200' is maintained higher than that inside the second chamber 300' and that inside the transfer chamber 100'.

The controller 400 controls the transfer chamber supply part 110' in communication with the first chamber 200' to allow supply of gas from the first chamber 200' into the transfer chamber 100'.

The controller 400 controls the transfer chamber exhaust part 120 to allow exhaust of gas inside the transfer chamber 100'. Therefore, the gas supplied into the transfer chamber 100' forms an updraft, and is exhausted out of the EFEM 10' through the transfer chamber exhaust part 120 along with fumes generated from the wafers.

As above, as high-pressure gas is supplied into and exhausted out of the transfer chamber 100', cleanliness of the transfer chamber 100' is managed.

In the second chamber 300', the controller 400 controls the second chamber exhaust part 320' so that the pressure inside the second chamber 300' measured by the second chamber sensor 330 falls within the third set pressure range. Therefore, the pressure inside the second chamber 300' is always maintained at a low pressure.

The controller 400 controls the transfer chamber supply part 110' and the transfer chamber exhaust part 120 so that the pressure inside the transfer chamber 100' measured by the transfer chamber sensor 130 falls within the first set pressure range. Therefore, the pressure inside the transfer chamber 100' is always maintained higher than that inside the second chamber 300'.

By the control of the controller 400 as above, the pressure inside the transfer chamber 100' is maintained lower than that outside the EFEM 10'.

In addition, the controller 400 controls the first chamber supply part 210' and the first chamber exhaust part so that the pressure inside the first chamber 200' measured by the first chamber sensor 230 falls within the second set pressure range. Therefore, the pressure inside the first chamber 200' is always maintained higher than that inside the second chamber 300'.

As above, as the pressure inside the first chamber 200' is maintained higher than that inside the transfer chamber 100' and that inside the second chamber 300', as illustrated by an arrow 'L1'' in FIG. 7, gas and fumes inside the first chamber 200' may unintentionally escape through a fine leak in an outer surface of the transfer chamber 100' and flow into the transfer chamber 100'.

In addition, as illustrated by an arrow 'L2'' in FIG. 7, gas and fumes inside the first chamber 200' may unintentionally escape through a fine leak in an outer surface of the first chamber 200' and flow into the second chamber 300'.

In addition, gas outside the EFEM 10' may unintentionally flow in through a fine leak in an outer surface of the second chamber 300' into the second chamber 300'.

In the EFEM 10' according to the second embodiment of the present disclosure, by always maintaining the pressure inside the first chamber 200' between the transfer chamber 100' and the second chamber 300' at a high pressure, gas and fumes inside the transfer chamber 100' from escaping out, and by always maintaining the pressure of the second chamber 300', which is the outermost chamber, at a low pressure, gas outside the EFEM 10' and gas escaping from the first chamber 200' are guided to flow into the second chamber 300', and all the gases inside the second chamber 300' are exhausted to the second chamber exhaust part 320'. Therefore, the EFEM 10' according to the second embodiment of the present disclosure can effectively prevent harmful gases such as fumes in the transfer chamber 100' from escaping out of the EFEM 10'.

In detail, in the case of an EFEM according to the related art, as a transfer chamber of the EFEM is manufactured in a large size, gas inside the transfer chamber escapes through a fine leak of the large transfer chamber of the EFEM, which causes a problem in that harmful gases escape out of the EFEM. Therefore, these harmful gases lead to many problems such as harming the health of workers. In order to solve such problem of the related art, in the case of the second embodiment, escape of gas inside the transfer chamber 100' is prevented through the first chamber 200', which is a high-pressure space, and inflow of gas from outside the EFEM 10' into the transfer chamber 100' is blocked through the second chamber 300', which is an exhaust space. Therefore, it is possible to effectively prevent escape of harmful gases inside the transfer chamber 100' to outside the EFEM 10' according to the second embodiment of the present disclosure, while blocking external gas outside the EFEM 10' from flowing into the transfer chamber 100'.

As above, in the EFEM 10' according to the second embodiment of the present disclosure, by the first chamber 200' and the second chamber 300', gas inside the transfer chamber 100' does not escape out of the EFEM 10', and at the same time, gas outside the EFEM 10' does not flow into the transfer chamber 100'. Therefore, the space inside the transfer chamber 100' forms a kind of independent space in which gas inflow and outflow with respect to the external space outside the EFEM 10' are blocked.

Each of the above-described transfer chamber supply part 110', transfer chamber exhaust part 120, first chamber supply part 210', first chamber exhaust part, and second chamber exhaust part 320' may include a flow controller.

The flow controller is connected to the controller 400.

The controller 400 operates the respective flow controllers according to the pressure inside the transfer chamber 100', the pressure inside the first chamber 200', and the pressure inside the second chamber 300', thereby easily controlling the flow rate of gas supplied or exhausted from the transfer chamber supply part 110', the transfer chamber exhaust part 120, the first chamber supply part 210', the first chamber exhaust part, and the second chamber exhaust part 320'.

Although the exemplary embodiments of the present disclosure have been described for illustrative purposes, those skilled in the art will appreciate that various modifications, additions, and substitutions are possible, without departing from the scope and spirit of the disclosure as defined by the appended claims. Therefore, the scope of the disclosure should be determined on the basis of the descriptions in the appended claims.

What is claimed is:

1. An equipment front end module (EFEM), comprising:
   a transfer chamber in which wafers are transferred between a wafer storage device and process equipment;
   a transfer chamber supply part provided at a lower portion of the transfer chamber to supply gas into the lower portion of the transfer chamber, wherein the transfer chamber supply part is provided with a fan filter unit (FFU); and
   a transfer chamber exhaust part provided at an upper portion of the transfer chamber to exhaust gas from the upper portion of the transfer chamber;
   a first opening allowing connection of a front-opening unified pod (FOUP) of the wafer storage device to the transfer chamber;
   a first door provided in the transfer chamber so as to open and close an inside of the first opening; and
   a controller controlling the transfer chamber supply part and the transfer chamber exhaust part,
   wherein the transfer chamber supply part is provided below the first opening and is formed in a lower inner surface of the transfer chamber,
   wherein the transfer chamber exhaust part is provided over the first opening and is formed in an upper inner surface of the transfer chamber, wherein the gas supplied by the transfer chamber supply part and exhausted by the transfer chamber exhaust part moves from the lower portion to the upper portion of the transfer chamber, and wherein the controller controls the transfer chamber exhaust part to allow exhaust of the gas inside the transfer chamber, so that the gas supplied into the transfer chamber forms an updraft and is exhausted out of the EFEM through the transfer chamber exhaust part along with fumes generated from the wafers.

2. The EFEM of claim 1, wherein the transfer chamber supply part is provided at a bottom of the transfer chamber to supply the gas in a direction from the lower portion to the upper portion of the transfer chamber, and wherein the transfer chamber exhaust part is provided at a top of the transfer chamber to exhaust the gas in the direction from the lower portion to the upper portion of the transfer chamber.

3. The EFEM of claim 1, further comprising:

a first chamber provided outside the transfer chamber;

a second chamber provided outside the first chamber;

a load port door provided in a load port so as to close an outside of the first opening; and a second door provided between the first door and the load port door, wherein, when the wafer storage device is disconnected from the EFEM, a first space in the first opening between the first door and the second door communicates with the first chamber, and a second space in the first opening between the second door and the load port door communicates with the second chamber.

* * * * *